(12) United States Patent
Sharma et al.

(10) Patent No.: US 12,323,143 B2
(45) Date of Patent: Jun. 3, 2025

(54) CHARGE PUMPS, LOGIC CIRCUITS INCLUDING CHARGE PUMPS, LOGIC DEVICES INCLUDING LOGIC CIRCUITS, AND METHODS OF OPERATING LOGIC CIRCUITS

(71) Applicant: GlobalFoundries U.S. Inc., Malta, NY (US)

(72) Inventors: Santosh Sharma, Austin, TX (US); Mei Yu Soh, Singapore (SG)

(73) Assignee: GlobalFoundries U.S. Inc., Malta, NY (US)

( * ) Notice: Subject to any disclaimer, the term of this patent is extended or adjusted under 35 U.S.C. 154(b) by 139 days.

(21) Appl. No.: 18/167,279

(22) Filed: Feb. 10, 2023

(65) Prior Publication Data

US 2024/0275385 A1   Aug. 15, 2024

(51) Int. Cl.
| | |
|---|---|
| H03K 19/0185 | (2006.01) |
| H03K 17/10 | (2006.01) |
| H03K 17/687 | (2006.01) |
| H03K 19/00 | (2006.01) |
| H03K 19/017 | (2006.01) |

(52) U.S. Cl.
CPC ... *H03K 19/018535* (2013.01); *H03K 17/102* (2013.01); *H03K 17/6871* (2013.01); *H03K 19/0013* (2013.01); *H03K 19/01721* (2013.01)

(58) Field of Classification Search
CPC .... H03K 17/10; H03K 17/102; H03K 17/107; H03K 17/687; H03K 17/6871; H03K 2017/6878; H03K 19/0008; H03K 19/0013; H03K 19/017; H03K 19/01721; H03K 19/0175

See application file for complete search history.

(56) References Cited

U.S. PATENT DOCUMENTS

| | | | |
|---|---|---|---|
| 8,604,512 B2 * | 12/2013 | Morita | H10D 84/401 |
| | | | 257/133 |
| 9,461,126 B2 | 10/2016 | Yamazaki et al. | |
| 10,454,481 B1 | 10/2019 | Sharma | |
| 10,554,112 B1 | 2/2020 | Sharma et al. | |

(Continued)

FOREIGN PATENT DOCUMENTS

| | | |
|---|---|---|
| CN | 113922812 A | 1/2022 |
| TW | 201347378 A | 7/2017 |

OTHER PUBLICATIONS

European Search Report for related application No. EP23195920.6 mailed Feb. 28, 2024.

(Continued)

*Primary Examiner* — Jason M Crawford

(57) ABSTRACT

A GaN logic circuit may include an input node receiving an input voltage, a first pull up transistor pulling up an output voltage in response to the input voltage, and a first depletion mode transistor having a first gate to which a first gate voltage is applied and a second gate to which a second gate voltage is applied. The first depletion mode transistor may control the first pull up transistor in response to a gate voltage difference between the first gate voltage and the second gate voltage. The logic device may further include a capacitor having a first end coupled to the first depletion mode transistor and a second end coupled to the first pull up transistor.

20 Claims, 4 Drawing Sheets

(56) References Cited

U.S. PATENT DOCUMENTS

| | | | |
|---|---|---|---|
| 2008/0278135 A1* | 11/2008 | De Lima Filho | G05F 1/575 |
| | | | 323/288 |
| 2011/0305054 A1* | 12/2011 | Yamagiwa | H01L 29/7787 |
| | | | 363/125 |
| 2017/0222644 A1* | 8/2017 | Kinzer | H10D 84/811 |
| 2017/0250685 A1* | 8/2017 | Bina | H01L 29/7397 |
| 2020/0044554 A1 | 2/2020 | Penzo et al. | |
| 2020/0335493 A1* | 10/2020 | Arnold | H10D 1/68 |
| 2021/0211128 A1* | 7/2021 | Chuang | H03K 17/693 |
| 2021/0408934 A1* | 12/2021 | Kinoshita | H02M 1/08 |
| 2023/0131602 A1* | 4/2023 | Arnold | H03K 17/136 |
| | | | 257/194 |
| 2024/0063301 A1* | 2/2024 | Sharma | H10D 62/8503 |
| 2024/0097555 A1* | 3/2024 | Ptacek | H02M 1/0006 |
| 2024/0128958 A1* | 4/2024 | Sharma | H03K 17/163 |
| 2024/0145469 A1* | 5/2024 | Sharma | H01L 27/085 |
| 2024/0275385 A1* | 8/2024 | Sharma | H03K 17/102 |

OTHER PUBLICATIONS

Barsan, "Analysis and Modeling of Dual-Gate MOSFET's", IEEE Transactions on Electron Devices, vol. ED-28, No. 5, May 1981, pp. 523-534, 10.1109/T-ED.1981.20377.

* cited by examiner

CHARGE PUMPS, LOGIC CIRCUITS INCLUDING CHARGE PUMPS, LOGIC DEVICES INCLUDING LOGIC CIRCUITS, AND METHODS OF OPERATING LOGIC CIRCUITS

BACKGROUND

An electronic system includes one or more logic circuits to perform predetermined logical operations. Conventional logic circuits may have a relatively slow operation speed to perform the logical operations, or consume a relatively large amount of electric power during the operations, or both, and thus fail to satisfy the requirements of the electronic system.

SUMMARY

Embodiments of the present disclosure relate to charge pumps, logic circuits including charge pumps, logic devices including logic circuits, and methods of operating logic circuits. In particular, embodiments of the present disclosure relate to GaN-based logic circuits, GaN-based logic devices, and methods of operating GaN-based logic circuits.

In an embodiment, a charge pump for a GaN logic circuit includes a first transistor pulling up an output voltage in response to an input voltage, and a second transistor having a first gate, a second gate, and an output terminal coupled to a gate of the first transistor.

In an embodiment, a GaN logic circuit includes an input node receiving an input voltage, a first pull up transistor pulling up an output voltage in response to the input voltage, and a first depletion mode transistor having a first gate to which a first gate voltage is applied and a second gate to which a second gate voltage is applied. The first depletion mode transistor may control the first pull up transistor in response to a gate voltage difference between the first gate voltage and the second gate voltage. The logic circuit may further include a capacitor having a first end coupled to the first depletion mode transistor and a second end coupled to the first pull up transistor.

In an embodiment, a logic device includes a logic gate receiving a pair of input signals and performing a logic operation on the received input signals to generate an intermediate signal, and a GaN inverter receiving the intermediate signal and generating an output signal. The inverter includes an input node receiving the intermediate signal, a pull up transistor configured to pull up the output signal in response to the intermediate signal, and a depletion mode transistor having a first gate to which a first gate voltage applies and a second gate to which a second gate voltage applies. The depletion mode transistor may control the pull up transistor in response to a gate voltage difference between the first gate voltage and the second gate voltage. The inverter may further include a capacitor having a first end coupled to the depletion mode transistor and a second end coupled to the pull up transistor.

In an embodiment, a method of operating a GaN logic circuit includes receiving an input voltage, adjusting a pinch off voltage and a first saturation current of a depletion mode transistor in response to a gate voltage difference between a first gate voltage and a second gate voltage, providing the first saturation current to pull down an output voltage to a third level when the input voltage has a first level and to pull up the output voltage to a fourth level when the input voltage has a second level, discharging a second saturation current to ground when the input voltage has the first level, and providing the second saturation current to the depletion mode transistor to adjust the gate voltage difference when the input voltage has the second level. The logic circuit may include the depletion mode transistor having a first gate to which the first gate voltage is applied and a second gate to which the second gate voltage is applied, and the first level may be higher than the second level.

DETAILED DESCRIPTION

Embodiments of the present disclosure relate to logic circuits, logic devices including one or more logic circuits, and methods of operating logic circuits. In particular, embodiments of the present disclosure relate to GaN-based logic circuits, GaN-based logic devices, and methods of operating GaN-based logic circuits.

A detailed description of embodiments is provided below along with accompanying figures. The scope of this disclosure is limited by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Figure 1:
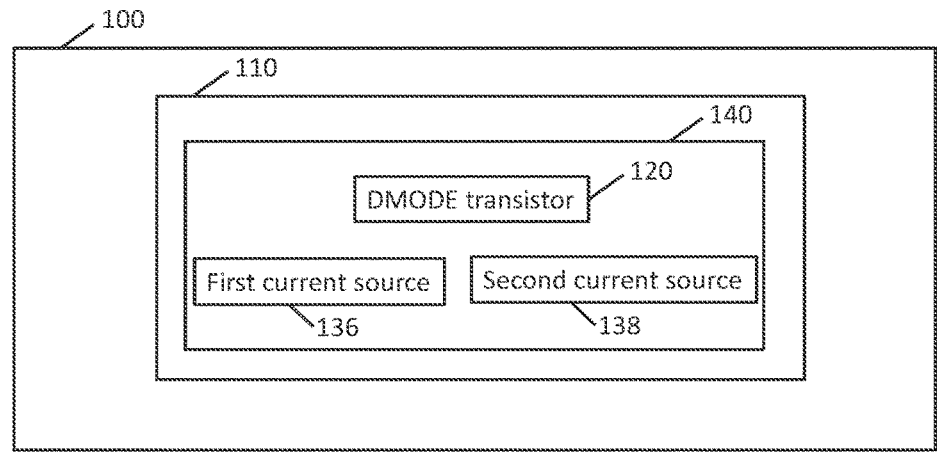
FIG. 1 illustrates a schematic diagram of a logic device according to an embodiment.

FIG. 1 illustrates a schematic diagram of a logic device 100 according to an embodiment. For example, the logic device 100 may be a driver for a power transistor, or a latch, or any one of various logic gates such as a NAND gate, a NOR gate, a buffer, an OR gate, and an AND gate.

The logic device 100 in FIG. 1 includes one or more logic circuits 110. For example, the logic circuit 110 may be an inverter.

The logic circuit 110 in FIG. 1 includes a charge pump 140, and the charge pump 140 may include a depletion mode transistor 120, a first current source 136, and a second current source 138. In an embodiment, the depletion mode transistor 120 has first and second gates to control a pinch off voltage and a first saturation current thereof.

When an input voltage has a first level, the depletion mode transistor 120 keeps each of the pinch off voltage and the first saturation current substantially constant when an input voltage has a first level. The first current source 136 in FIG. 1 discharges a second saturation current, and the second current source 138 in FIG. 1 discharges the first saturation current. Each of the first saturation current and the second saturation current may have a relatively small magnitude, thereby reducing power consumption of the logic circuit 110 during the operation.

When the input voltage has a second level, the first current source 136 in FIG. 1 provides the second saturation current to the depletion mode transistor 120 to increase a gate voltage difference between a first gate voltage applied to the first gate and a second gate voltage applied to the second gate. Each of the pinch off voltage and the first saturation current of the depletion mode transistor 120 increases in a given manner with the increased gate voltage difference to increase an output voltage of the logic circuit 110, which further increases the gate voltage difference and the first saturation current in turn. Such a positive feedback makes the output voltage of the logic circuit 110 reach a target level in a relatively short period, thereby increasing an operation speed of the logic circuit 110.

Figure 2:
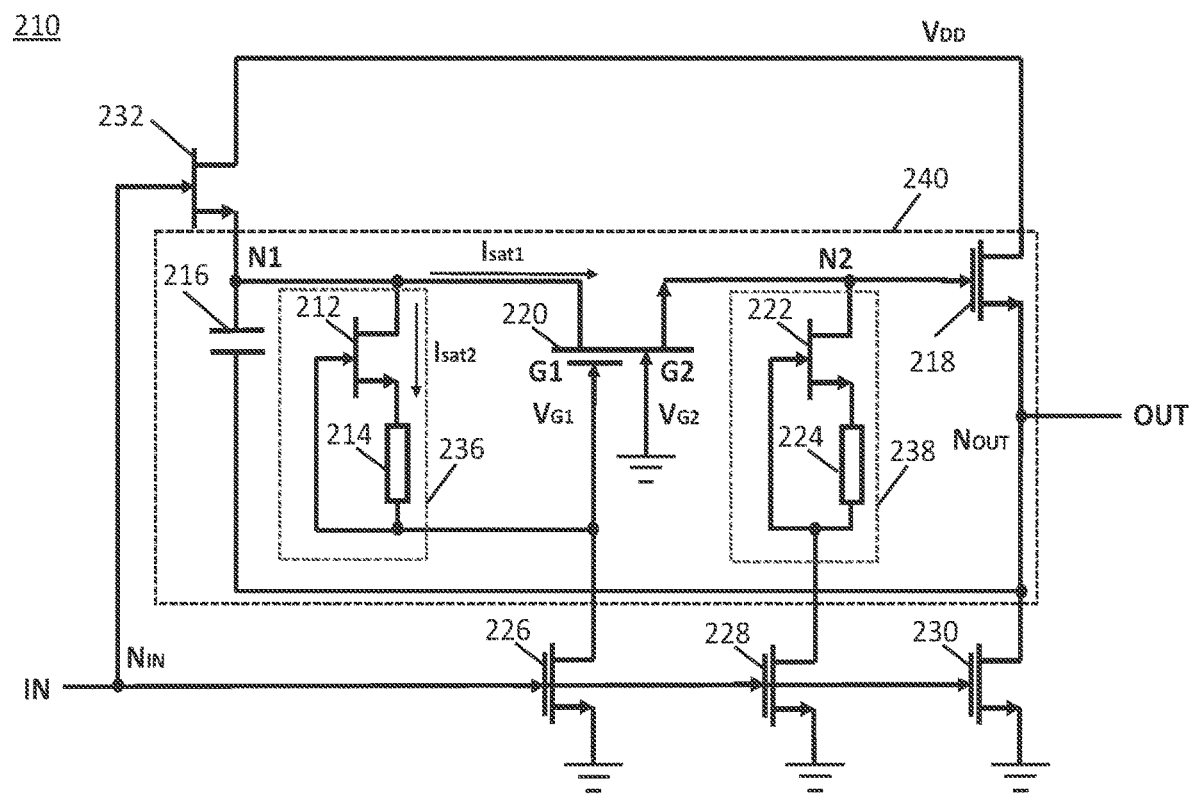
FIG. 2 illustrates an inverter suitable for use as the logic circuit in FIG. 1 according to an embodiment.

FIG. 2 illustrates an inverter 210 suitable for use as the logic circuit 110 in FIG. 1 according to an embodiment. In an embodiment, the inverter 210 in FIG. 2 includes a substrate including GaN on which one or more circuit elements are implemented.

The inverter 210 in FIG. 2 includes a first transistor 220, a second transistor 212, a third transistor 222, a first resistor 214, and a second resistor 224. In an embodiment, the first transistor 220 in FIG. 2 is a depletion mode transistor having first and second gates G1 and G2 to adjust a saturation current and a pinch off voltage thereof. For example, the saturation current and the pinch off voltage of the first transistor 220 may be adjusted in response to a gate voltage difference $V_{G1}-V_{G2}$ between a first gate voltage $V_{G1}$ applied to the first gate G1 and a second gate voltage $V_{G2}$ applied to the second gate G2. The second transistor 212 in FIG. 2 is a depletion mode transistor having a drain coupled to a first node N1, a source coupled to a first end of the first resistor 214, and a gate coupled to a second end of the first resistor 214. The third transistor 222 in FIG. 2 is a depletion mode transistor having a drain coupled to a second node N2, a source coupled to a first end of the second resistor 224, and a gate coupled to a second end of the second resistor 224.

The inverter 210 in FIG. 2 further includes a first pull up transistor 218, a second pull up transistor 232, a capacitor 216, a first pull down transistor 226, a second pull down transistor 228, and a third pull down transistor 230. The first pull up transistor 218 in FIG. 2 is an enhancement mode transistor having a drain coupled to a power supply voltage $V_{DD}$, a source coupled to an output node $N_{OUT}$ generating an output signal (e.g., an output voltage) OUT, and a gate coupled to the second node N2. The second pull up transistor 232 in FIG. 2 is a depletion mode transistor having a drain coupled to the power supply voltage $V_{DD}$, a source coupled to the first node N1, and a gate coupled to an input node $N_{IN}$ receiving an input signal (e.g., an input voltage) IN. The capacitor 216 in FIG. 2 has a first end coupled to the first node N1 and a second end coupled to the output node $N_{OUT}$. The first pull down transistor 226 in FIG. 2 is an enhancement mode transistor having a drain coupled to the second end of the first resistor 214, a source coupled to ground, and a gate coupled to the input node $N_{IN}$. The second pull down transistor 228 in FIG. 2 is an enhancement mode transistor having a drain coupled to the second end of the second resistor 224, a source coupled to the ground, and a gate coupled to the input node $N_{IN}$. The third pull down transistor 230 in FIG. 2 is an enhancement mode transistor having a drain coupled to the output node $N_{OUT}$, a source coupled to the ground, and a gate coupled to the input node $N_{IN}$.

Figure 3:
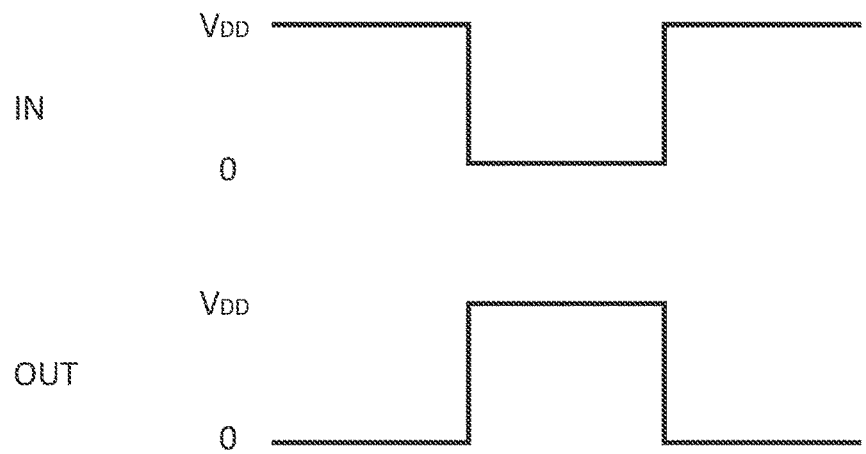
FIG. 3 is a waveform diagram illustrating an operation of the inverter in FIG. 2 according to an embodiment.
Figure 4A:
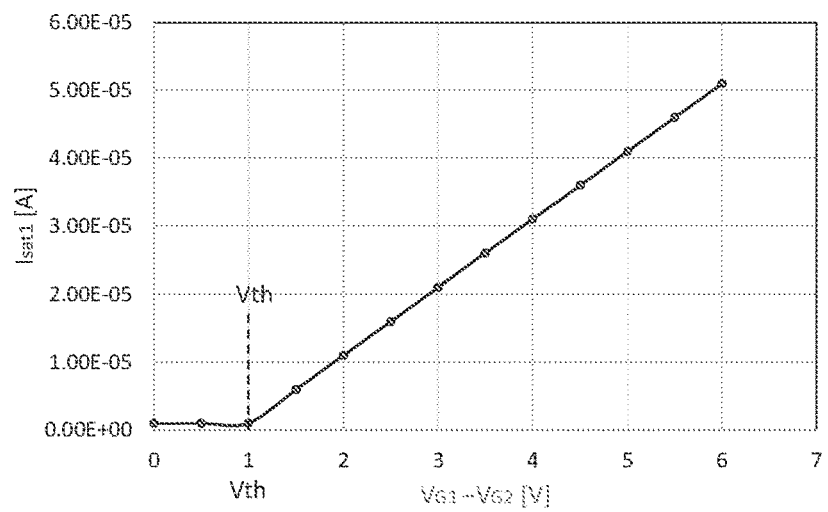
FIGS. 4A and 4B illustrate a saturation current and a pinch off voltage of a depletion mode transistor, respectively, as a function of a gate voltage difference between a first gate voltage and a second gate voltage of the depletion mode transistor according to an embodiment.
Figure 4B:
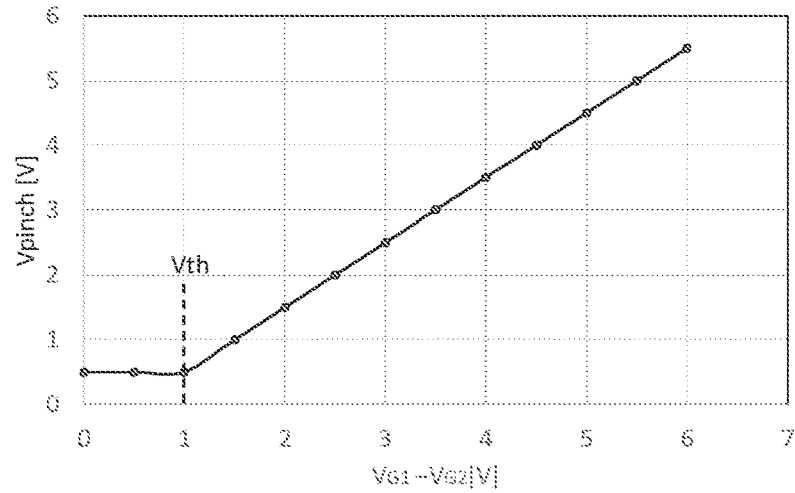

FIG. 3 is a waveform diagram illustrating an operation of the inverter 210 in FIG. 2 according to an embodiment. FIGS. 4A and 4B illustrate a first saturation current $I_{sat1}$ and a pinch off voltage $V_{pinch}$ of the first transistor 220 in FIG. 2, respectively, as a function of a gate voltage difference $V_{G1}-V_{G2}$ between a first gate voltage $V_{G1}$ and a second gate voltage $V_{G2}$ of the first transistor 220 according to an embodiment.

When the input voltage IN has a first level indicative of a logic high value (e.g., $V_{DD}$), the first pull down transistor 226 is turned on to pull down the first gate voltage $V_{G1}$ of the first transistor 220 to ground (e.g., 0V) or substantially ground, and the second pull up transistor 232 is turned on to pull up a voltage at the first node N1 to the power supply voltage $V_{DD}$. The second transistor 212 and the first resistor 214 together function as a first current source 236 to discharge a second saturation current $I_{sat2}$ to ground. In an embodiment, the first resistor 214 has a relatively high resistance value to make the second saturation current $I_{sat2}$ have a relatively small magnitude. For example, the resistance value of the first resistor 214 may be in a range from to 10 kohm (kΩ) to 1 Megaohm (MΩ). As a result, the first gate voltage $V_{G1}$ at the first gate G1 of the first transistor 220 is maintained at a level equal to or substantially equal to ground. The second gate G2 of the first transistor 220 is coupled to ground, and thus a second gate voltage $V_{G2}$ has a level equal to or substantially equal to ground.

Referring to FIGS. 4A and 4B, when the first gate voltage $V_{G1}$ and a second gate voltage $V_{G2}$ each have a level substantially equal to 0V, the first saturation current $I_{sat1}$ of the first transistor 220 has a substantially constant and relatively small magnitude (e.g., about 1 µA) and the pinch off voltage $V_{pinch}$ of the first transistor 220 has a substantially constant and relatively small level (e.g., about 0.5V). As a result, referring back to FIG. 2, the first saturation current $I_{sat1}$ having a relatively small magnitude flows through the first transistor 220, and a voltage at the second node N2 becomes substantially equal to the pinch off voltage $V_{pinch}$ having a relatively small level.

When the input voltage IN has the first level, the second pull down transistor 228 is turned on. The first saturation current $I_{sat1}$ has a relatively small magnitude, and the third transistor 222 and the second resistor 224 together function as a second current source 238 to discharge the first saturation current $I_{sat1}$ to ground. As a result, the voltage at the second node N2 is maintained at a level sufficiently small to keep the first pull up transistor 218 turned off. In an embodiment, the voltage at the second node N2 may be maintained at a level substantially equal to or less than 50%, 25%, or 10% of a threshold voltage of the first pull up transistor 218. Since the first pull up transistor 218 is turned off and the third pull down transistor 230 is turned on in response to the input voltage IN having the first level, the output voltage OUT is pulled down to a third level (e.g., ground or substantially ground). Since each of the first saturation current $I_{sat1}$ and the second saturation current $I_{sat2}$ has a relatively small magnitude, power consumption of the inverter 210 may be reduced during the operation.

When the input voltage IN has a second level indicative of a logic low value (e.g., 0 V), the second pull up transistor 232 is turned off to make the first end of the capacitor 216 float. The first, second, and third pull down transistors 226, 228, and 230 are turned off to electrically disconnect the second ends of the first and second resistors 214 and 224 from the ground and make the second end of the capacitor 216 float. The second saturation current $I_{sat2}$ flows through the second transistor 212 and the first resistor 214 into the first gate G1 of the first transistor 220 to increase the first gate voltage $V_{G1}$ as well as the gate voltage difference $V_{G1}-V_{G2}$. Referring to FIGS. 4A and 4B, when the increased gate voltage difference $V_{G1}-V_{G2}$ reaches a threshold voltage $V_{th}$ of the first transistor 220, the first saturation current $I_{sat1}$ and the pinch off voltage $V_{pinch}$ of the first transistor 220 start to increase substantially linearly with the gate voltage difference $V_{G1}-V_{G2}$.

Referring back to FIG. 2, the charge pump 240 includes the first transistor 220, the first pull up transistor 218, the capacitor 216, the first current source 236, the second current source 238, the first node N1, the second node N2, and the output node $N_{OUT}$. The first transistor 220 provides the first saturation current $I_{sat1}$ to pull up the output voltage OUT from the third level (e.g., 0V) to a fourth level (e.g., the power supply voltage $V_{DD}$) when the input voltage has the second level. For example, the first saturation current $I_{sat1}$ flowing through the first transistor 220 increases and the third transistor 222 and the second resistors 224 are electrically disconnected from the ground, and thus the voltage at the gate of the first pull up transistor 218 increases sufficiently to turn on the first pull up transistor 218. The first pull up transistor 218 increases the output voltage OUT at the output node $N_{OUT}$, which increases a voltage at the second end of the capacitor 216 coupled to the output node $N_{OUT}$ as well as a voltage at the first end of the capacitor 216. A voltage at the first node N1 coupled to the first end of the capacitor 216 also increases to further increase the first gate voltage $V_{G1}$ of the first transistor 220, leading to a further increase in the gate voltage difference $V_{G1}-V_{G2}$ as well as a further increase in the first saturation current $I_{sat1}$ in turn. Such a positive feedback of the charge pump 240 makes the output voltage OUT reach the power supply voltage $V_{DD}$ in a relatively short period, thereby increasing an operation speed of the inverter 210.

According to the embodiment shown in FIGS. 4A and 4B, the first saturation current $I_{sat1}$ of the first transistor 220 has a substantially constant and relatively small magnitude and the pinch off voltage $V_{pinch}$ of the first transistor 220 has a substantially constant and relatively small level when the gate voltage difference $V_{G1}-V_{G2}$ is less than a threshold voltage Vth. In contrast, each of the first saturation current $I_{sat1}$ and the pinch off voltage $V_{pinch}$ of the first transistor 220 increases substantially linearly with the gate voltage difference $V_{G1}-V_{G2}$ when the gate voltage difference $V_{G1}-V_{G2}$ is equal to or greater than the threshold voltage Vth. However, embodiments of the present disclosure are not limited thereto. In other embodiments, each of the first saturation current $I_{sat1}$ and the pinch off voltage $V_{pinch}$ of the first transistor 220 increases substantially exponentially with the gate voltage difference $V_{G1}-V_{G2}$ when the gate voltage difference $V_{G1}-V_{G2}$ is equal to or greater than the threshold voltage Vth, thereby making the output voltage OUT reach the power supply voltage $V_{DD}$ faster compared to when the first saturation current $I_{sat1}$ increases substantially linearly with the gate voltage difference $V_{G1}-V_{G2}$. Details of the structure of the first transistor 220 and the fabrication method thereof can be found in pending U.S. patent application Ser. No. 17/819,980, entitled "INTEGRATED DEPLETION AND ENHANCEMENT MODE GALLIUM NITRIDE HIGH-ELECTRON MOBILITY TRANSISTORS" and filed on Aug. 16, 2022, and pending U.S. patent application Ser. No. 17/902,463, entitled "HIGH-ELECTRON-MOBILITY TRANSISTOR" and filed on Feb. 2, 2022, the entire contents of which are incorporated herein by reference.

Figure 5:
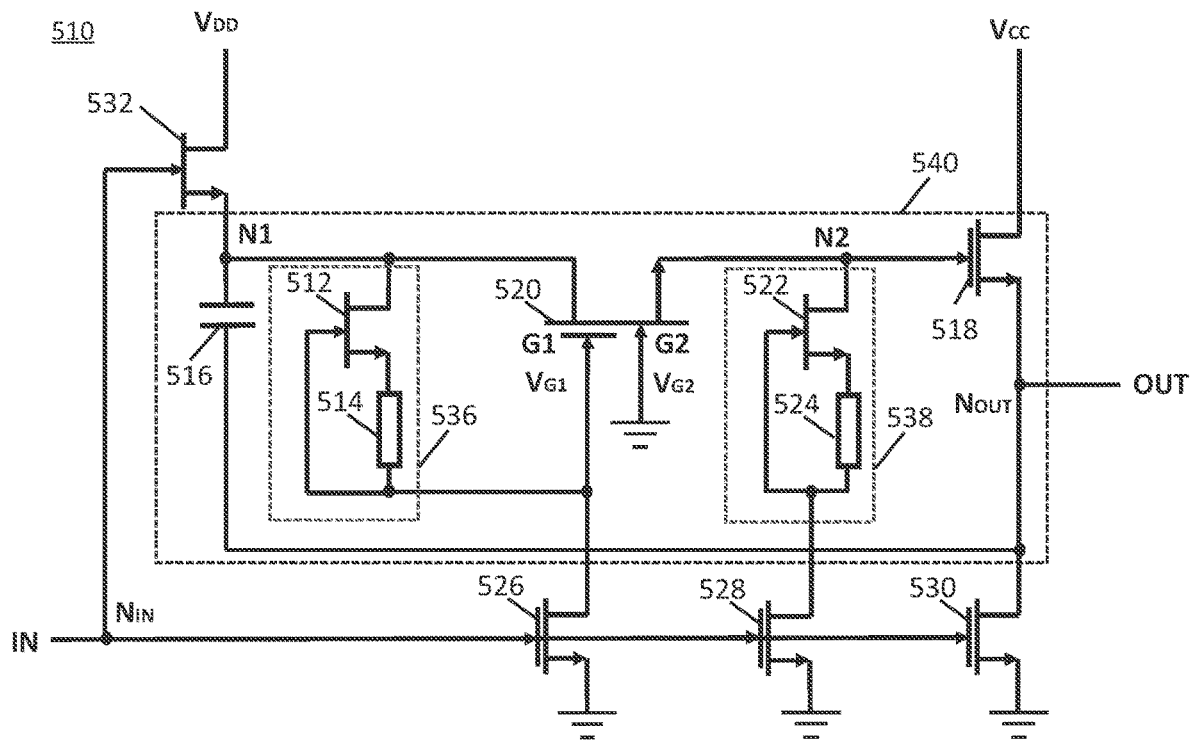
FIG. 5 illustrates an inverter suitable for use as the logic circuit in FIG. 1 according to an embodiment.
Figure 6:
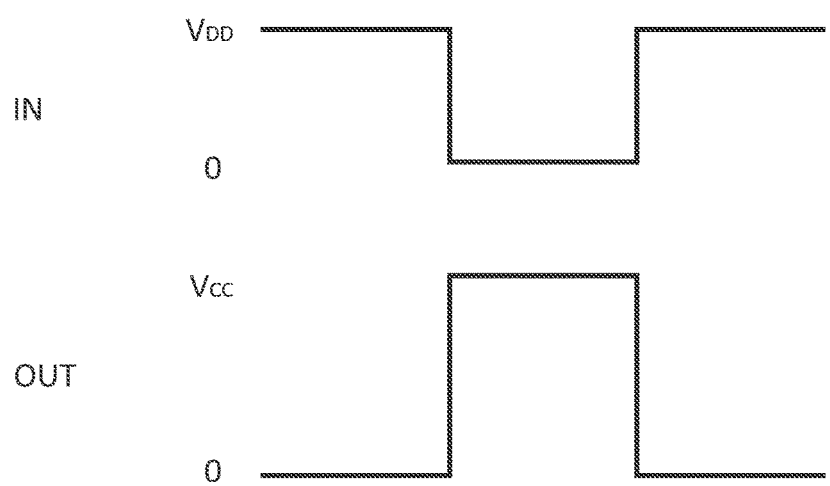
FIG. 6 is a waveform diagram illustrating an operation of the inverter in FIG. 5 according to an embodiment.

FIG. 5 illustrates an inverter 510 suitable for use as the inverter 110 in FIG. 1 according to an embodiment. FIG. 6 is a waveform diagram illustrating an operation of the inverter 510 according to an embodiment. The inverter 510 in FIG. 5 includes similar elements to those of the inverter 210 in FIG. 2, and an operation of the inverter 510 in FIG. 5 is similar to that of the inverter 210 in FIG. 2. Accordingly, detailed descriptions on these similar elements and operation may be omitted in the following disclosure in the interest of brevity.

The inverter 510 of FIG. 5 differs from the inverter 210 of FIG. 2 in that the inverter 510 includes a first pull up transistor 518 having a drain coupled to a second power supply voltage $V_{CC}$, rather than a first power supply voltage $V_{DD}$. As a result, the operation of the inverter 510 in FIG. 5 differs from that of the inverter 210 in FIG. 2 in that the output voltage OUT has a level substantially equal to the second power supply voltage $V_{CC}$, rather than the first power supply voltage $V_{DD}$, when the input voltage IN has a logic low value (e.g., 0V). In an embodiment, the second power supply voltage $V_{CC}$ has a level different from that of the first power supply voltage $V_{DD}$, such that the inverter 510 functions as a level shifter circuit. For example, the second power supply voltage $V_{CC}$ may have a level that is greater (e.g., about twice as great as) than that of the first power supply voltage $V_{DD}$.

Figure 7:
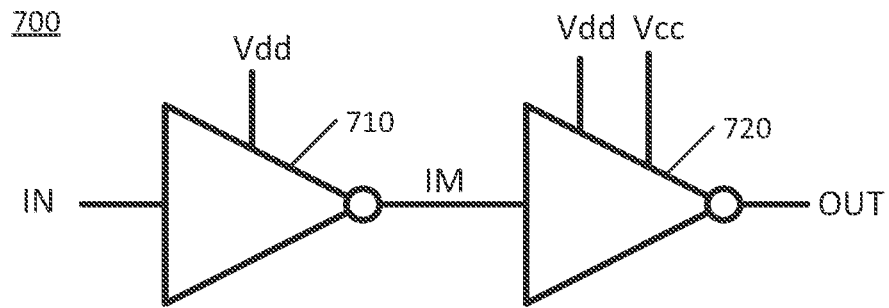
FIG. 7 illustrates a buffer according to an embodiment.

FIG. 7 illustrates a buffer 700 according to an embodiment. In an embodiment, the buffer 700 includes a substrate including GaN on which one or more circuit elements are implemented.

The buffer 700 in FIG. 7 includes a first inverter 710 and a second inverter 720. In an embodiment, the first inverter 710 may be similar or identical to the inverter 210 in FIG. 2, and the second inverter 720 may be similar or identical to the inverter 510 in FIG. 5. For example, the first inverter 710 in FIG. 7 receives an input signal (e.g., an input voltage) IN and outputs an intermediate signal (e.g., an intermediate voltage) IM changing between ground and a first power supply voltage $V_{DD}$. The second inverter 720 in FIG. 7 receives the intermediate signal IM and outputs an output signal (e.g., an output voltage) OUT changing between ground and a second power supply voltage $V_{CC}$.

Figure 8:
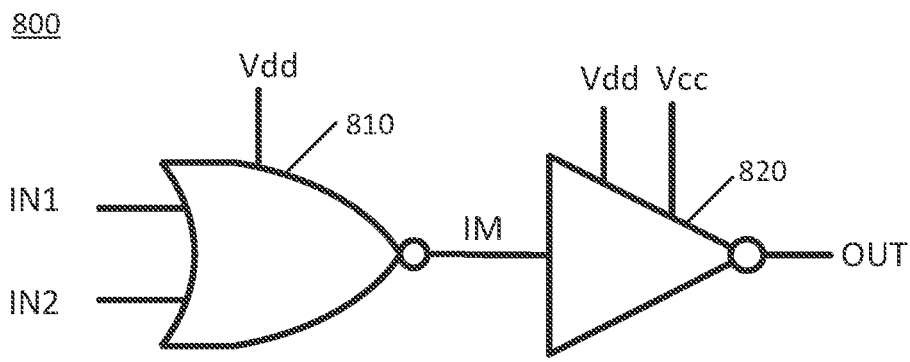
FIG. 8 illustrates an OR gate according to an embodiment.

FIG. 8 illustrates an OR gate 800 according to an embodiment. In an embodiment, the OR gate 800 includes a substrate including GaN on which one or more circuit elements are implemented.

The OR gate 800 in FIG. 8 includes a NOR gate 810 and an inverter 820. In an embodiment, the inverter 820 may be similar or identical to the inverter 510 in FIG. 5. For example, the NOR gate 850 in FIG. 8 receives a first input signal IN1 and a second input signal IN2 and performs an NOR operation on the first and second input signals IN1 and IN2 to output an intermediate signal IM changing between ground and a first power supply voltage $V_{DD}$. The inverter 820 in FIG. 8 receives the intermediate signal IM and outputs an output signal OUT changing between ground and a second power supply voltage $V_{CC}$.

Figure 9:
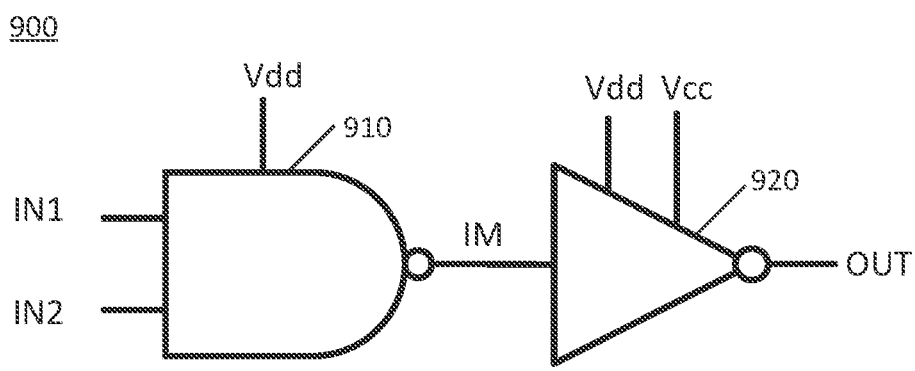
FIG. 9 illustrates an AND gate according to an embodiment.

FIG. 9 illustrates an AND gate 900 according to an embodiment. In an embodiment, the AND gate 900 includes a substrate including GaN on which one or more circuit elements are implemented.

The AND gate 900 in FIG. 9 includes a NAND gate 910 and an inverter 920. In an embodiment, the inverter 920 may be similar or identical to the inverter 510 in FIG. 5. For example, the NAND gate 910 in FIG. 9 receives a first input signal IN1 and a second input signal IN2 and performs a NAND operation on the first and second input signals IN1 and IN2 to output an intermediate signal IM changing between ground and a first power supply voltage $V_{DD}$. The inverter 920 in FIG. 9 receives the intermediate signal IM and outputs an output signal OUT changing between ground and a second power supply voltage $V_{CC}$.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

The invention claimed is:

1. A charge pump for a GaN logic circuit, comprising:
   a first transistor configured to pull down an output voltage in response to an input voltage having a first level and pull up the output voltage in response to the input voltage having a second level; and
   a second transistor having a first gate, a second gate, and an output terminal coupled to a gate of the first transistor and being configured to provide a first saturation current therethrough,
   wherein the second transistor is configured to adjust the first saturation current therethrough by a second saturation current flowing into the first gate of the second transistor in response to the input voltage having the second level.

2. The charge pump of claim 1, wherein the second transistor is a depletion mode transistor, and the output terminal of the depletion mode transistor is controlled by a gate voltage difference between a first gate voltage applied to the first gate and a second gate voltage applied to the second gate, the charge pump further comprising:
   a capacitor having a first end coupled to the second transistor and a second end coupled to the first transistor.

3. The charge pump of claim 2, wherein the depletion mode transistor adjusts a pinch off voltage thereof and the first saturation current in response to the gate voltage difference.

4. The charge pump of claim 3, wherein the output terminal of the depletion mode transistor is a source coupled to the gate of the first transistor, and the depletion mode transistor further has a drain coupled to the first end of the capacitor.

5. The charge pump of claim 1, wherein the second transistor is a depletion mode transistor, the charge pump further comprising:
   a first current source configured to discharge the second saturation current to ground when the input voltage has the first level, and to provide the second saturation current to the depletion mode transistor to adjust the gate voltage difference when the input voltage has the second level.

6. The charge pump of claim 5, wherein the depletion mode transistor is a first depletion mode transistor, and wherein the first current source includes:
   a first resistor having a first end and a second end, the second end coupled to the first gate of the first depletion mode transistor; and
   a second depletion mode transistor having a source coupled to the first end of the first resistor, a gate coupled to the second end of the first resistor, and a drain coupled to the drain of the first depletion mode transistor.

7. The charge pump of claim 6, further comprising:
   a second current source configured to discharge the first saturation current to the ground when the input voltage has the first level.

8. The charge pump of claim 7, wherein the second current source includes:
   a second resistor having a first end and a second end; and
   a third depletion mode transistor having a drain coupled to the source of the first depletion mode transistor, a source coupled to the first end of the second resistor, a gate coupled to the second end of the second resistor.

9. The charge pump of claim 1, wherein the second transistor has a drain coupled to a source of a third transistor.

10. A GaN logic circuit, comprising:
    an input node configured to receive an input voltage;
    a first pull up transistor configured to pull up an output voltage in response to the input voltage;
    a first depletion mode transistor having a first gate to which a first gate voltage is applied and a second gate to which a second gate voltage is applied, the first depletion mode transistor configured to control the first pull up transistor by adjusting a first saturation current through the first depletion mode transistor in response to a gate voltage difference between the first gate voltage and the second gate voltage;
    a capacitor having a first end coupled to the first depletion mode transistor and a second end coupled to the first pull up transistor; and
    a first current source configured to discharge a second saturation current to ground when the input voltage has a first level, and to provide the second saturation current to the first depletion mode transistor to adjust the gate voltage difference when the input voltage has a second level.

11. The GaN logic circuit of claim 10, wherein the first depletion mode transistor adjusts a pinch off voltage thereof in response to the gate voltage difference, and provides the first saturation current to pull down the output voltage to a third level when the input voltage has the first level and to pull up the output voltage to a fourth level when the input voltage has the second level, the first level being higher than the second level.

12. The GaN logic circuit of claim 11, wherein the first depletion mode transistor keeps each of the pinch off voltage and the first saturation current substantially constant to pull down the output voltage to the third level when the input voltage has the first level, and increases each of the pinch off voltage and the first saturation current substantially linearly with the gate voltage difference to pull up the output voltage to the fourth level when the input voltage has the second level.

13. The GaN logic circuit of claim 11, wherein a power supply voltage has the fourth level, and the first pull up transistor is further configured to receive the first saturation current from the first depletion transistor and to pull up the output voltage to the power supply voltage when the input voltage has the second level, the circuit further comprising:
    a second pull up transistor configured to pull up a voltage at the first end of the capacitor to the power supply voltage when the input voltage has the first level, and make the first end of the capacitor float when the input voltage has the second level.

14. The GaN logic circuit of claim 13, wherein the first pull up transistor has a drain coupled to the power supply voltage, a gate coupled to a source of the first depletion mode transistor, and a source coupled to the output node, and
wherein the second pull up transistor has a drain coupled to the power supply voltage, a gate coupled to the input node, and a source coupled to the first end of the capacitor.

15. The GaN logic circuit of claim 11, wherein the power supply voltage is a first power supply voltage, the circuit further comprising:
a second pull up transistor configured to pull up a voltage at the first end of the capacitor to a second power supply voltage when the input voltage has the first level, and make the first end of the capacitor float when the input voltage has the second level, the second power supply voltage having a level different from that of the first power supply voltage.

16. The GaN logic circuit of claim 10, wherein the first current source includes:
a first resistor having a first end and a second end, the second end coupled to the first gate of the first depletion mode transistor; and
a second depletion mode transistor having a source coupled to the first end of the first resistor, a gate coupled to the second end of the first resistor, and a drain coupled to a drain of the first depletion mode transistor.

17. The GaN logic circuit of claim 16, wherein the first resistor has a resistance value in a range from 10 kohm (kΩ) to 1 Megaohm (MΩ).

18. The GaN logic circuit of claim 16, further comprising:
a first pull down transistor having a drain coupled to the second end of the first resistor, a gate coupled to the input node, and a source coupled to the ground.

19. The GaN logic circuit of claim 10, further comprising:
a second current source configured to discharge the first saturation current to the ground when the input voltage has the first level.

20. A logic device, comprising:
a logic gate configured to receive a pair of input signals and performs a logic operation on the received input signals to generate an intermediate signal; and
a GaN inverter configured to receive the intermediate signal and generate an output signal, the inverter comprising:
an input node configured to receive the intermediate signal;
a first pull up transistor configured to pull up the output signal in response to the intermediate signal;
a depletion mode transistor having a first gate to which a first gate voltage applies and a second gate to which a second gate voltage applies, the depletion mode transistor configured to control the first pull up transistor in response to a gate voltage difference between the first gate voltage and the second gate voltage;
a capacitor having a first end coupled to the depletion mode transistor and a second end coupled to the first pull up transistor; and
a second pull up transistor configured to pull up a voltage at the first end of the capacitor to a power supply voltage when the intermediate signal has a first level, and make the first end of the capacitor float when the intermediate signal has a second level.

* * * * *